United States Patent
van den Brom et al.

(10) Patent No.: US 9,362,084 B2
(45) Date of Patent: Jun. 7, 2016

(54) ELECTRO-OPTICAL ELEMENT FOR MULTIPLE BEAM ALIGNMENT

(75) Inventors: Alrik van den Brom, Utrecht (NL); Stijn Willem Herman Karel Steenbrink, The Hague (NL); Marco Jan-Jaco Wieland, Delft (NL); Guido De Boer, Leerdam (NL); Pieter Kappelhof, Delft (NL)

(73) Assignee: MAPPER LITHOGRAPHY IP B.V., Delft (NL)

(*) Notice: Subject to any disclaimer, the term of this patent is extended or adjusted under 35 U.S.C. 154(b) by 0 days.

(21) Appl. No.: 13/458,936

(22) Filed: Apr. 27, 2012

(65) Prior Publication Data

US 2012/0273691 A1 Nov. 1, 2012

Related U.S. Application Data

(60) Provisional application No. 61/480,152, filed on Apr. 28, 2011, provisional application No. 61/533,286, filed on Sep. 12, 2011.

(30) Foreign Application Priority Data

Sep. 12, 2011 (NL) ...................................... 2007392

(51) Int. Cl.
  *H01J 37/20* (2006.01)
  *H01J 37/317* (2006.01)
(52) U.S. Cl.
  CPC .............. *H01J 37/20* (2013.01); *H01J 37/3174* (2013.01); *H01J 2237/03* (2013.01); *H01J 2237/0437* (2013.01); *H01J 2237/153* (2013.01)
(58) Field of Classification Search
  CPC ..................... H01J 37/3177; H01J 2237/0435; H01J 2237/31774; H01J 2237/032; H01J 37/147; H01J 37/1471; H01J 2237/03

USPC ........... 250/306, 307, 310, 311, 492.1, 492.2, 250/492.21, 492.22, 492.23, 492.3, 494.1, 250/522.1
See application file for complete search history.

(56) References Cited

U.S. PATENT DOCUMENTS 3,967,115 A * 6/1976 Kern .............................. 250/251
4,200,794 A * 4/1980 Newberry et al. ...... 250/396 ML
(Continued)

FOREIGN PATENT DOCUMENTS

| JP | 2003015006 | 1/2003 |
| JP | 2005057110 | 3/2005 |

(Continued)

OTHER PUBLICATIONS

Japanese Office Action with English Language Translation, dated Dec. 15, 2015, Japanese Application No. 2014-528902.

*Primary Examiner* — Brooke Purinton
(74) *Attorney, Agent, or Firm* — Blakely Sokoloff Taylor & Zafman LLP

(57) ABSTRACT

The invention relates to a charged particle system for processing a target surface with at least one charged particle beam. The system comprises an optical column with a beam generator module for generating a plurality of charged particle beams, a beam modulator module for switching on and off said plurality of beams and a beam projector module for projecting beams or subbeams on said target surface. The system further comprises a frame supporting each of said modules in a fixed position and alignment elements for aligning at least one of beams and/or subbeams with a downstream module element.

15 Claims, 10 Drawing Sheets

(56) References Cited

U.S. PATENT DOCUMENTS

| | | | |
|---|---|---|---|
| 4,661,709 A * | 4/1987 | Walker et al. | 250/396 R |
| 4,683,366 A * | 7/1987 | Harte et al. | 250/492.2 |
| 4,694,178 A * | 9/1987 | Harte | 250/396 R |
| 6,797,969 B2 * | 9/2004 | Gerlach et al. | 250/492.3 |
| 6,870,171 B2 * | 3/2005 | Hosoda et al. | 250/492.22 |
| 6,943,351 B2 * | 9/2005 | Parker et al. | 250/396 R |
| 6,989,546 B2 * | 1/2006 | Loschner et al. | 250/492.22 |
| 2003/0155534 A1 | 8/2003 | Platzgummer et al. | |
| 2003/0183778 A1 * | 10/2003 | Haraguchi | B82Y 10/00 250/492.2 |
| 2005/0077475 A1 | 4/2005 | Nagae et al. | |
| 2005/0134972 A1 | 6/2005 | Kugler et al. | |
| 2006/0151716 A1 * | 7/2006 | Choi et al. | 250/492.1 |
| 2007/0177282 A1 | 8/2007 | Makino et al. | |
| 2009/0057577 A1 * | 3/2009 | Parker | B82Y 10/00 250/492.23 |
| 2009/0140160 A1 | 6/2009 | Platzgummer et al. | |
| 2009/0200495 A1 * | 8/2009 | Platzgummer | 250/492.22 |
| 2009/0212229 A1 * | 8/2009 | Wieland et al. | 250/396 R |
| 2010/0026976 A1 | 2/2010 | Meehan et al. | |
| 2011/0042579 A1 | 2/2011 | De Boer et al. | |
| 2011/0279802 A1 | 11/2011 | Pnini-Mittler | |

FOREIGN PATENT DOCUMENTS

| | | | |
|---|---|---|---|
| JP | 2005123264 | 5/2005 | |
| JP | 2007515797 | 6/2007 | |
| JP | 2007200958 | 8/2007 | |
| JP | 2010041047 | 2/2010 | |
| JP | 2011164295 | 8/2011 | |
| JP | 2011242770 | 12/2011 | |
| WO | WO2009141428 | * 11/2009 | H01J 37/317 |
| WO | WO-2010094719 | 8/2010 | |

* cited by examiner

ELECTRO-OPTICAL ELEMENT FOR MULTIPLE BEAM ALIGNMENT

This is a non-provisional application claiming the benefit of U.S. Provisional Application Number 61/480,152, field Apr. 28, 2011, and U.S. Provisional Application Number 61/533,286 filed Sep. 12, 2011.

BACKGROUND

The invention relates to a charged particle system, such as a multi beam lithography system. Charged particle systems, such as (multi) electron beam systems, are being developed for high throughput maskless lithography systems, (multi) electron beam microscopy and (multi) electron beam induced deposition devices.

Many of these charged particle systems have complex modules arranged for specific tasks. In order to facilitate maintenance of these modules, a malfunctioning module can be removed from the charged particle system and can be replaced by a (new or repaired) functioning module.

However, some charge particle systems, especially some maskless lithography systems, use a large number of charged particle beams for processing a target (or wafer), for example more than 10.000. If these charged particle beams pass through several modules, the alignment of these modules with respect to each other after replacement of one of the modules becomes difficult because of the required accuracy of the alignment. This is especially the case when a typical beam spot of the charged particle beam and a typical distance between two neighbouring beam is in the range of micrometers, or below.

A complex and therefore time consuming alignment procedure after the replacement of modules would extend the downtime of a system more than is desirable.

When building the lithography system or the microscopy system, the various functional modules or elements are mounted in a frame. Although the accurate alignment of the functional elements with respect to each other provides a challenge on its own, this alignment can be impervious to thermal expansion or contraction of the functional elements and/or the frame. It may therefore be a problem to arrange modules in a stack with high accuracy and preferably wherein the alignment of the functional elements is at least substantially independent from temperature variations.

It is an object of the present invention to provide a solution, at least in part, for at least one of the above identified problems.

SUMMARY OF THE INVENTION

According to a first aspect of the invention, the object of the invention is achieved by providing a Charged particle system for processing a target surface with charged particle beams, the system comprising an optical column for projecting said beams on the target surface, wherein the optical column comprises:
  a beam generator module, comprising a beam generator for generating a plurality of charged particle beams, substantially directed to a beam modulator module;
  said beam modulator module comprising module elements comprising a beam modulator for receiving said plurality of beams from the beam generator module and for switching on and off said plurality of beams or a plurality of subbeams generated from said beams;
  a beam projector module comprising a beam projector for receiving at least part of said plurality of beams or said plurality of subbeams and for projecting at least some of received beams or subbeams on said target surface, the beam projector comprising module elements comprising
  a projection lens array for projecting said at least some of the received beams or subbeams on the target surface;
  and wherein the system further comprises:
    a frame supporting each of said modules in a fixed position; and,
    alignment elements for aligning at least one of said plurality of beams and/or said plurality of subbeams with a downstream module element.

In lithography systems, for example a charged particle system for processing a target surface with charged particle beams, the target surface is usually a surface of a wafer. The lithography system may be a so-called maskless lithography system.

According to the invention, the optical column comprises three, preferably replaceable, modules. In this case, the first and the third module need only to be aligned with one other module, while only one module, the second or middle module, needs to be aligned with two modules. This reduces the complexity of the alignment procedure, while enabling the separate replacement of the main elements of the optical column.

The alignment elements may be provided adjacent to, inside of, or as part of a module. They may comprise mechanical elements to move (and thus align) a module as a whole. They may also comprise electro-optical elements to align charged particle beams or subbeams within or between the modules using electrical fields.

In an embodiment of the charged particle system according to the invention, the alignment elements are arranged for aligning all of said plurality of beams and/or said plurality of subbeams with said pertaining downstream module element.

In an embodiment of the charged particle system according to the invention, the alignment elements comprise an actuator arranged for rotating the beam generator about a z-axis, parallel with an optical axis of the optical column, and/or for moving the beam generator in an x-direction and/or y-direction, the x-direction being perpendicular to the z-axis and the y-direction being perpendicular to both the z-axis and the x-direction, wherein the actuator is preferably part of the beam generator module.

The actuator of this embodiment is able to align the beam generator with respect to the next module, in particular the beam modulator module, by moving and rotating the beam generator with respect thereto.

It may be possible to align the beam generator by using only electro-optical elements. However, the electro-optical elements may increase the total height of the optical column. However, the height of the optical column may be limited and an increased height may increase the positional errors between beams (beam-to-beam errors). Therefore, it may be advantageous to provide a (mechanical) actuator to align the beam generator with respect to the beam modulator. The actuator may be provided without increasing the height of the optical column.

In an embodiment of the charged particle system according to the invention, the beam generator comprises module elements including:
  a beam source for generating a charge particle macro beam; and,
  an aperture array for generating a plurality of charged particle beams from said charged particle macro beam.

In a further embodiment of the charged particle system according to the invention, the module elements of the beam generator further comprise:

a collimator lens for collimating the charged particle macro beam generated by the beam source; and,
  an aberration corrector for correcting aberration errors in said macro beam.

Since the charged particle macro beam, generated by the beam source is a divergent beam, a collimator is used to obtain a less divergent beam. However, the collimator may introduce aberration errors, which can be corrected by an aberration corrector.

The aberration corrector may comprise two electrodes with a specific shape for generating an electrical field when a voltage difference is applied to these two electrodes. The charged particle macro beam will be at least partly deflected by the electrical field of the aberration corrector. The shape of electrodes and the voltage difference may be chosen such that aberration errors are corrected, at least to some extend.

The aperture array may be provided in the beam generator to split the collimated, aberration corrected, charged particle macro beam into at least one charged particle beams. In some embodiments, the number of the charged particle beams may be in the range of 10000-15000, or preferably in the range of 12000-14000.

The beam source of system needs to be replaced whenever it has been depleted. That is a reason to provide a separate module with the beam source.

In an embodiment of the charged particle system according to the invention, a voltage difference is applied between the aberration corrector and the aperture array, thereby providing a lens effect to each aperture of the aperture array, preferably a negative lens effect.

An advantage of the negative lens effect is that the generated charged particle beams will leave the beam generator as divergent beams, which contributes to the alignment of the beam generator with respect to the beam modulator, as will be explained below.

In an embodiment of the charged particle system according to the invention, the beam modulator comprises module elements, wherein said module elements comprise:

a modulation aperture array for deflecting some of said plurality of beams or said plurality of sub beam to a beam stop area to prevent these from being projected on the target surface.

The modulation aperture array which may be arranged for deflecting some of said plurality of subbeams to a beam stop area is a complex element. With thousands of (sub) beams and a processing speed of about a wafer per hour, the amount of data per second that has to be sent to the modulation aperture array to operate it, is very large. As a consequence, the modulation aperture array may be connected to many data cables, for example optical fibers. This complex element may require regular maintenance. Having a module with the modulation aperture array has the advantage of easy maintenance.

In addition, a projection lens array for projecting (sub) beams on the target surface will be more easily contaminated by secondary particles, which are generated when the (sub) beams hit the target, than other elements of the optical column that may be provided further away from the target surface. An easy replacement of the projection lens array may thus be required, which indicates that also the projection lens array should be contained in a separate module.

In the light of the above, three modules are provided according to the invention, the first module containing the beam source, the second (and middle) module containing the beam modulator, or in particular the modulation aperture array, and the third module containing the projection lens array.

In an embodiment of the charged particle system according to the invention, the module elements of the beam modulation module comprises a beam stop aperture array with said beam stop area; or, wherein the module elements of the beam projector comprises a beam stop aperture array with said beam stop area.

In an embodiment of the charged particle system according to the invention, the alignment elements comprise a deflector array for deflecting said plurality of beams from the aperture array in the x-direction and/or y-direction, wherein said deflector array is preferably arranged between the aperture array and the modulation aperture array and wherein said deflector array is preferably arranged in the beam modulator.

The deflector array may comprise an array of deflectors, wherein each deflector is arranged for deflecting at least one of the at least one charged particle beams. The deflector array may contribute to the alignment of the beam generator with respect to the beam modulator, in particular by correcting possible positional and/or angular errors.

In an embodiment of the charged particle system according to the invention, wherein the alignment elements comprise a set of two subsequent deflector arrays, wherein the set is arranged for displacing said at least part of said plurality of beams or said plurality of subbeams in the x-direction and/or the y-direction with respect to the beam stop array, wherein said set is preferably arranged between the modulation aperture array and the beam stop aperture array and wherein said set is preferably arranged in the beam projector module. In a further embodiment, one of said two deflector arrays is arranged for deflecting said at least part of said plurality of beams or said plurality of subbeams in an x-direction and/or a y-direction.

The set of two subsequent deflector arrays may contribute to the alignment of plurality of beams or sub beams with respect to the beam projector. Both deflectors are each arranged for deflecting in the x- and/or the y-direction. The combination of two deflector array enables not only the deflection of subbeams but also the displacement of the subbeams without changing its inclination angle.

The set of two subsequent deflector arrays, being electro-optical elements, may contribute to the height of the optical column between the modulation aperture array and the beam stop aperture array. Since the beam-to-beam errors in the subbeams may have been minimized by a beam corrector array, the effect of the height of the optical column between the modulation aperture array and the beam stop aperture array on the positional beam-to-beam errors may be limited. Therefore, mechanical alignment means (such as an actuator) may not be necessary.

In an embodiment of the charged particle system according to the invention, the modulation aperture array is further arranged for generating a plurality of subbeams from said plurality of beams.

In an embodiment of the charged particle system according to the invention, the module elements of the beam modulator further comprise a focus lens array for focusing said plurality of beams or said plurality of subbeams.

The beam generator may generate more or less divergent beams, while it may be required that the (sub) beams entering the beam projector are focused to a certain extend on the beam stop aperture array of the beam projector. Therefore, focusing is performed in the beam modulator, which can take place before or after splitting the beams into the plurality of subbeams.

In an embodiment of the charged particle system according to the invention, the module elements of the beam modulator further comprise a beam corrector array for correcting individual angular errors of said plurality of beams or said plurality of subbeams. In a further embodiment, the focus lens array is an Einzel lens array, comprising three subsequent electrode arrays, wherein the beam corrector array is the middle electrode array of said three subsequent electrode arrays.

An advantage of using the beam corrector array as the middle electrode array is that it enables the construction of a compact beam corrector focus lens assembly.

In an embodiment of the charged particle system according to the invention, the beam corrector array is arranged between the aperture array and the modulation aperture array. However, in another embodiment, the beam corrector array may be arranged between the modulation aperture array and the beam projector. In this embodiment, the beam corrector array may be arranged for correcting angular errors of at least one subbeam, in particular a group of subbeams generated by the modulation aperture array from a single charged particle beam In an embodiment of the charged particle system according to the invention, the module elements of beam modulator further comprise a current limiting aperture array for shielding the beam corrector array, wherein the current limiting aperture is arranged between the aperture array and the beam corrector array.

The current limiting aperture array comprises an array of current limiting apertures, each arranged for limiting the current of a beam or a subbeam.

The beams coming from the beam generator may be divergent. Without a current limiting aperture array, the charged particles may impinge on the electrodes of the beam corrector array and/or on electrodes of the focus lens array and cause damage. Therefore, providing a shielding current limiting aperture array is advantageous.

In an embodiment of the charged particle system according to the invention, a respective spot of said plurality of beams or said plurality of subbeams on the modulation aperture array and/or on the current limiting aperture array is larger than a respective aperture of said array(s).

In this embodiment, the current limiting aperture array (or the modulation aperture array) will stop (i.e. absorb) some charged particles in the radial outer portion of the beams. This may contributes to the alignment of the beam with respect to the beam modulator, since small positional error can in this case be allowed. These small positional errors will only influence where the charged particles are stopped or absorbed in the current limiting aperture array (or modulation aperture array). The charged particle beams passing through the apertures will not be influenced by these small positional errors.

The spot of the beams on the modulation aperture array and/or on the current limiting aperture array may be controlled by controlling the divergence of the beams when leaving the beam generator. This can be achieved by controlling the negative lens effect, which is mentioned above.

According to another aspect of the invention, the above mentioned objective is met by providing a method for aligning at least one of a plurality of beams and/or a plurality of subbeams with a pertaining downstream module element in a charged particle system according to any of claims 1-17, comprising the steps of:

a) rotating the beam generator about a z-axis, parallel with an optical axis of the optical column, and/or moving the beam generator in an x-direction and/or y-direction, the x-direction being perpendicular to the z-axis and the y-direction being perpendicular to both the z-axis and the x-direction.

In an embodiment of the method according to the invention, the method further comprises the step of:

b) deflecting said plurality of charged particle beams from the aperture array, in the x-direction and/or y-direction.

In an embodiment of the method according to the invention, the method further comprises the step of:

c) deflecting said at least part of said plurality of subbeams in an x-direction and/or a y-direction. In an embodiment of the method according to the invention, the method further comprises the step of:

d) displacing said plurality of beams or said plurality of subbeams in the x-direction and/or the y-direction with respect to the beam stop array, using one or more deflector arrays.

In an embodiment of the method according to the invention, the method further comprises, before step a), the step of:

0) arranging one or more of said modules in a fixed position in said frame.

The effects and advantages of the embodiments of the method according to the invention may be similar or identical to the effects and advantages described above with respect to the embodiments of the charged particle system, mutatis mutandis.

According to a third aspect of the invention, the invention provides an assembly for providing an aligned stack of two or more modules in a stacking direction, wherein each of the two or more modules comprises three support members, wherein the assembly comprises a frame comprising three planar alignment surfaces which extend in the stacking direction and which are angularly off-set with respect to each other, and wherein each of the three support members of each one of the two or more modules, when arranged in said frame, abuts against a corresponding one of the three alignment surfaces. According to the invention each module is supported by three support members, which provides a stable support of the module. In addition the orientation of each module in the stack is controlled by the abutment of each of the three support member against the corresponding planar alignment surface. In particular, because the orientation of the two or more modules in the stack is controlled by the same three planar alignment surfaces, the two or more modules can be arranged in the stack with high accuracy.

In an embodiment, each one of the three planar alignment surfaces extends in a corresponding plane, wherein the corresponding planes of the three planar alignment surfaces intersect in one intersecting line, which intersecting line extends in the stacking direction. Since each of the support members of a module abuts its corresponding alignment surface, any expansion or contraction of a module due to changes in temperature results in a shift of the support member along its corresponding alignment surface. The intersecting line defines a thermal centre line of the stack. The position of this thermal centre line is at least substantially independent from temperature variations. Thus, the alignment of functional elements arranged at or near the thermal centre line, is at least substantially independent from temperature variations.

In an embodiment, said assembly further comprising a pre-load member for applying a force on at least one of the two or more modules for pushing the three support members of the at least one of the two or more modules against the corresponding one of the three alignment surfaces. The pre-load member is arranged to at least substantially ensure the abutment of the support members against the corresponding alignment surfaces, and thus to ensure the accurate alignment of the modules in the stack.

In an embodiment, said frame further comprises three support surfaces arranged in a first plane for supporting the support members of a first module of said two or more modules, and wherein the frame comprises three support surfaces arranged in a second plane for supporting the support members of a second module of said two or more modules, wherein the second plane is at least substantially parallel to the first plane. The support surfaces inter alia define the position of the modules in the stack direction. The combination of the alignment surfaces and the support surfaces provides an accurate position and orientation of the modules in the stack in respect with each other.

In an embodiment, the first and second plane extend at least substantially perpendicular to the stacking direction. In this embodiment, the abutment of the three support members against the three alignment surfaces determine the position of the module in the plane perpendicular to the stacking direction, and the orientation with respect to a rotation around the stacking direction. In addition, the abutment of the three support members on the support surfaces determine the position of the modules along the stack direction and the orientation with respect to a rotation around an axis perpendicular to the stacking direction.

In an embodiment, each of the three support surfaces for supporting the support members of a first module are arranged adjacent to one of the three planar alignment surfaces. This allows for a relatively small support member to abut at the same time against a alignment surface and an adjacent support surface.

In an embodiment, the three support surfaces for supporting the support members of the second module are arranged above the three support surfaces for supporting the support members of the first module. Each module of this embodiment can be supported at its own level in the frame.

In an embodiment, the three support members of the second module are arranged at least substantially outside a triangle defined by the three support members of the first module. At least in the stack direction, the position of the support members for the second module do not overlap with the position of the support members for the first module, which at least substantially prevents an interference or obstruction when positioning the first and/or second module.

In an embodiment, at least one of said support members of the two or more modules is a ball, preferably wherein each support member is a ball.

In an embodiment, each of the three planar alignment surfaces is arranged in an at least substantially vertical plane, wherein said vertical planes intersect in an at least substantially vertical intersecting line which intersecting line defines the thermal centre of the aligned stack.

In an embodiment, the frame is provided with an opening between two of the three plane alignment surfaces for inserting the two or more modules in the assembly. Each one of the two or more modules can thus be individually inserted in and removed from the frame via the opening, in particular without the need to handle an other one of the two or more modules.

In an embodiment, the assembly comprises rails for supporting and guiding at least one of the two or modules during an insertion thereof in the assembly, wherein the rails are arranged such that an inserted module is free from said rail. When inserting a module, said module is supported and guided by rails for the convenience of the operator and for directing said module towards the correct position in the stack. However, when the module is at the correct position, said module is only supported by its support members on the support surfaces and against the alignment surfaces, and said module is free from the rails.

In an embodiment, each of the three planar alignment surfaces for aligning all modules of said stack of two or more modules in a stacking direction, is a side-surface of a monolithic alignment block which is connected to the frame, wherein the monolithic alignment block is made from a hard material, such as titanium, and wherein the side-surface preferably is provided with a diamond like coating.

In an embodiment, each of the three planar alignment surfaces is arranged on a ridge. This embodiment thus comprises three ridges, wherein each of said ridges provides a stop surface for a corresponding support member of the modules. Such a ridge can be machined with a much higher accuracy than a whole alignment surface, and therefore provides a higher accuracy of the alignment of the modules in the stack.

In an embodiment, said ridge is an at least substantially straight ridge. In an embodiment said ridges extend in the stacking direction, and said ridges preferably also recede from each other in the stacking direction.

In an embodiment, each of the support surfaces adjacent to one of the three plane alignment surfaces are arranged in a monolithic support block which is connected to the frame, wherein the monolithic supporting block is made from a hard material, such as titanium, and wherein the support surfaces preferably are provided with a diamond like coating.

In an embodiment, the lithography system comprises:
a first module comprising a projection lens for projecting said one or more charged particle beams onto a target,
a second module comprising a deflector for said one or more charged particle beams, and
a third module comprising a source for one or more charged particle beams,
wherein the first, second and third modules are inserted in the assembly to provide accurately aligned stack of said modules.

In an embodiment, the source, the deflector and the projection lens are arranged at least substantially at or near the thermal centre of the aligned stack.

According to another aspect, the invention provides a microscopy system comprising an assembly as described above.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
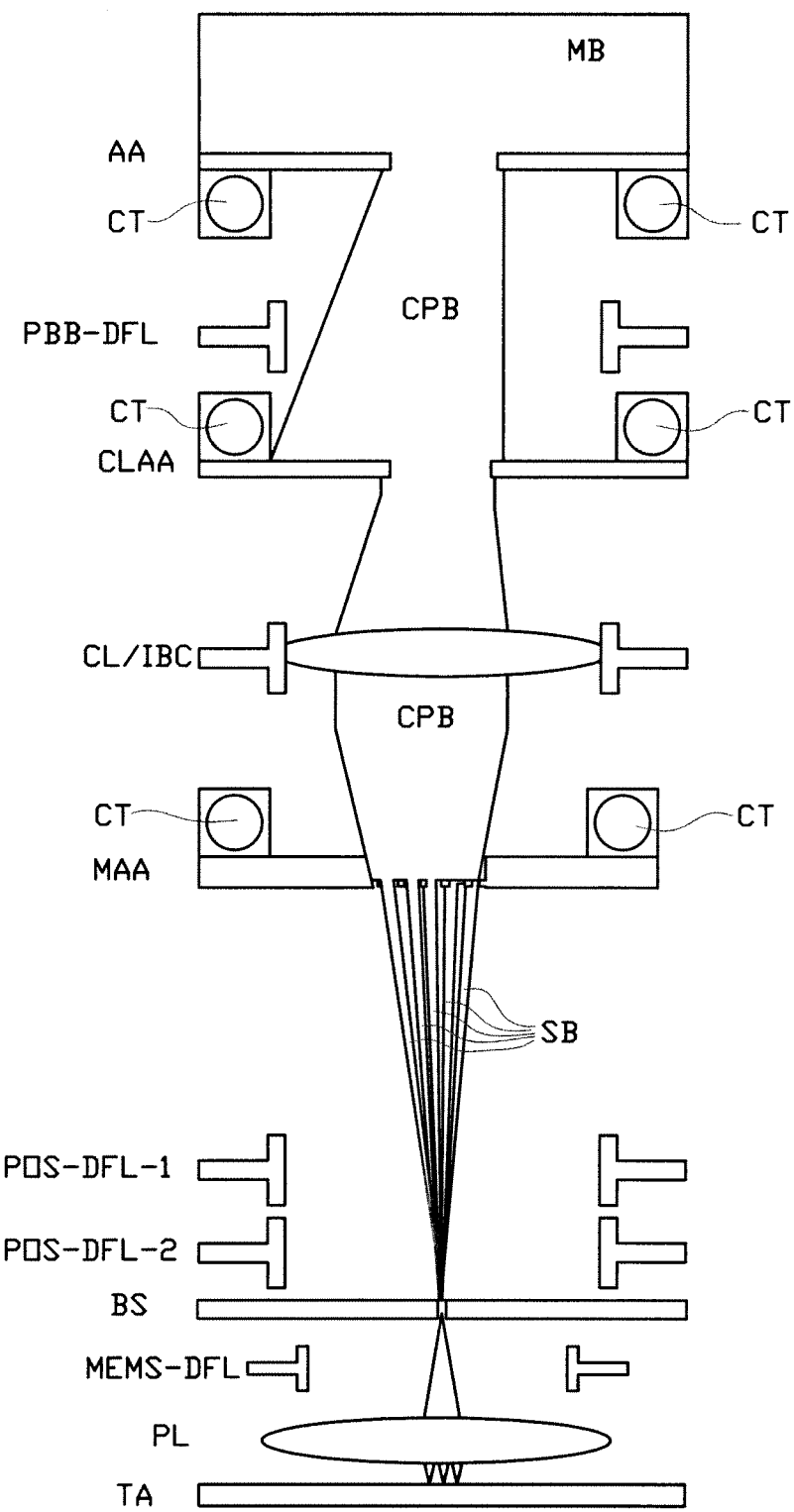
FIG. 1 shows a schematic overview of an optical column according to an embodiment of the invention.

FIG. 1 shows a schematic overview of an optical column according to an embodiment of the invention. Such an optical column may be found in a lithography system according to an embodiment of the invention. In the optical column a charged particle beam CPB is generated by an aperture array AA when a macro beam MB is split up in one or more charged particle beam CPB. The at least one charged particle beam CPB may be deflected by deflector PBB-DFL. The charged particle beam CPB is received by a current limiting aperture array CLAA. The current limiting aperture array CLAA may limit the current of charged particles of the charged particle beam CPB.

Next, the charged particle beam may be collimated and corrected by element CL/IBC, which may comprise a collimating lens CL in a combination with an individual beam corrector IBC.

The collimated charged particle beam may impinge on a modulation aperture array MAA, which may divide the charged particle beam CPB into many subbeams SB. The modulation aperture array MAA may also comprise a blanker array for individually deflecting subbeams onto a beam stop BS. When a subbeam is deflected by the blanker array, it will not pass through the beam stop and will not reach the target TA. When a subbeam SB is not deflected by the blanker array, it will pass through an opening of the beam stop.

However, before reaching the beam stop, the subbeam or a group of subbeams may be deflected by a first deflector POS-DFL-1 and/or a second deflector POS-DFL-2.

After passing the beam stop, the subbeams are scanned over the target TA using a scanning deflector HEMS-DFL and a projection lens PL.

Figure 2:
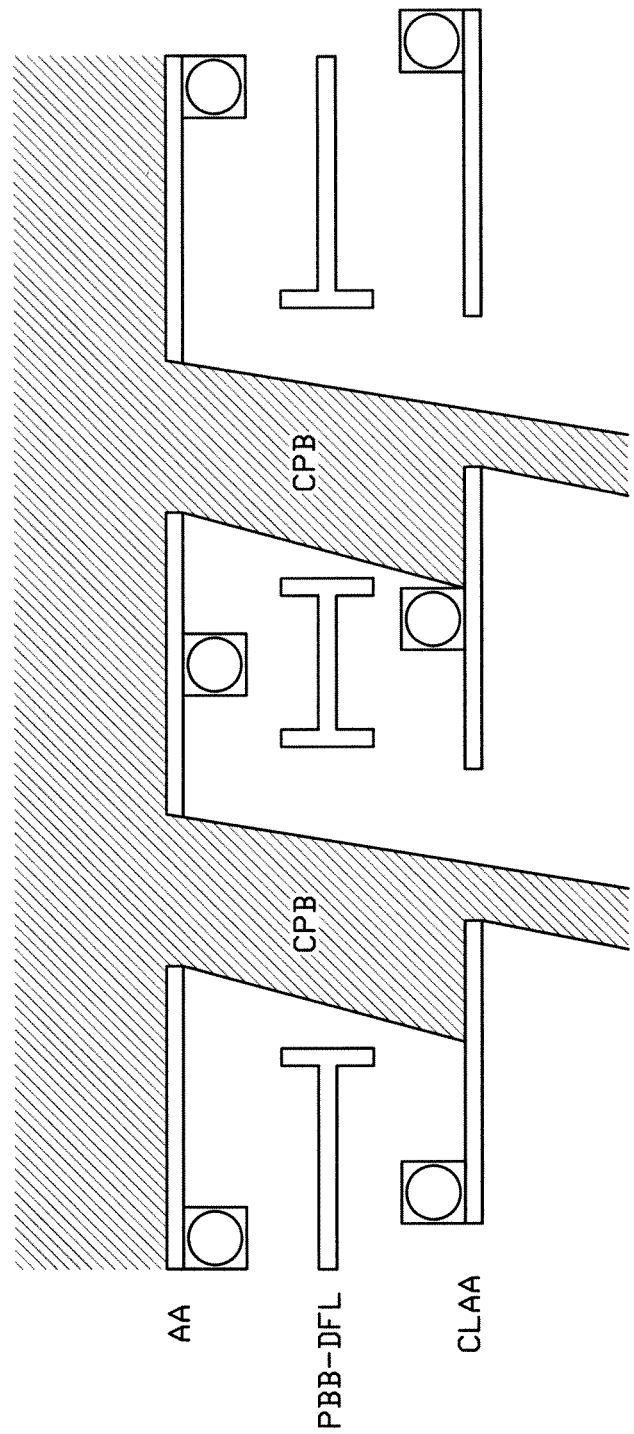
FIG. 2 illustrates schematically possible alignment errors in a lithography system.

As can be seen from FIG. 1, the alignment of the different elements in the optical column needs to be accurate. FIG. 2 illustrates the effects of a misalignment of the aperture array AA with the current limiting aperture array CLAA, in particular when the current limiting aperture array CLAA is displaced with respect to the aperture array AA. This causes all charged particle beams CPB to have a positional error on the CLAA.

In general, positional errors may refer to errors in the x-, y- and z-position of the optical axis of a beam, or more in particular errors in the x- and y- position of the intersection of the optical axis with the receiving module. Furthermore, angular errors may refer to errors in the orientation of the optical axis, with respect to rotation about an x-axis, a y-axis and or a z-axis (referred to as Rx-, Ry- and Rz-errors respectively), or more particular to the angle defined by the intersection of the optical axis with the receiving module.

When multiple beams are used, a common error (positional or angular) is an error that all or a group of beams exhibit. In contrast, a beam-to-beam error (positional or angular) is an individual error that a beam exhibit with respect to another beam. The latter may be caused by productions errors with respect to the locations of the apertures of the current limiting aperture. Or it may be the case that a lens of a module may not deflect all charged particle beams passing through it in the same manner.

Figure 3:
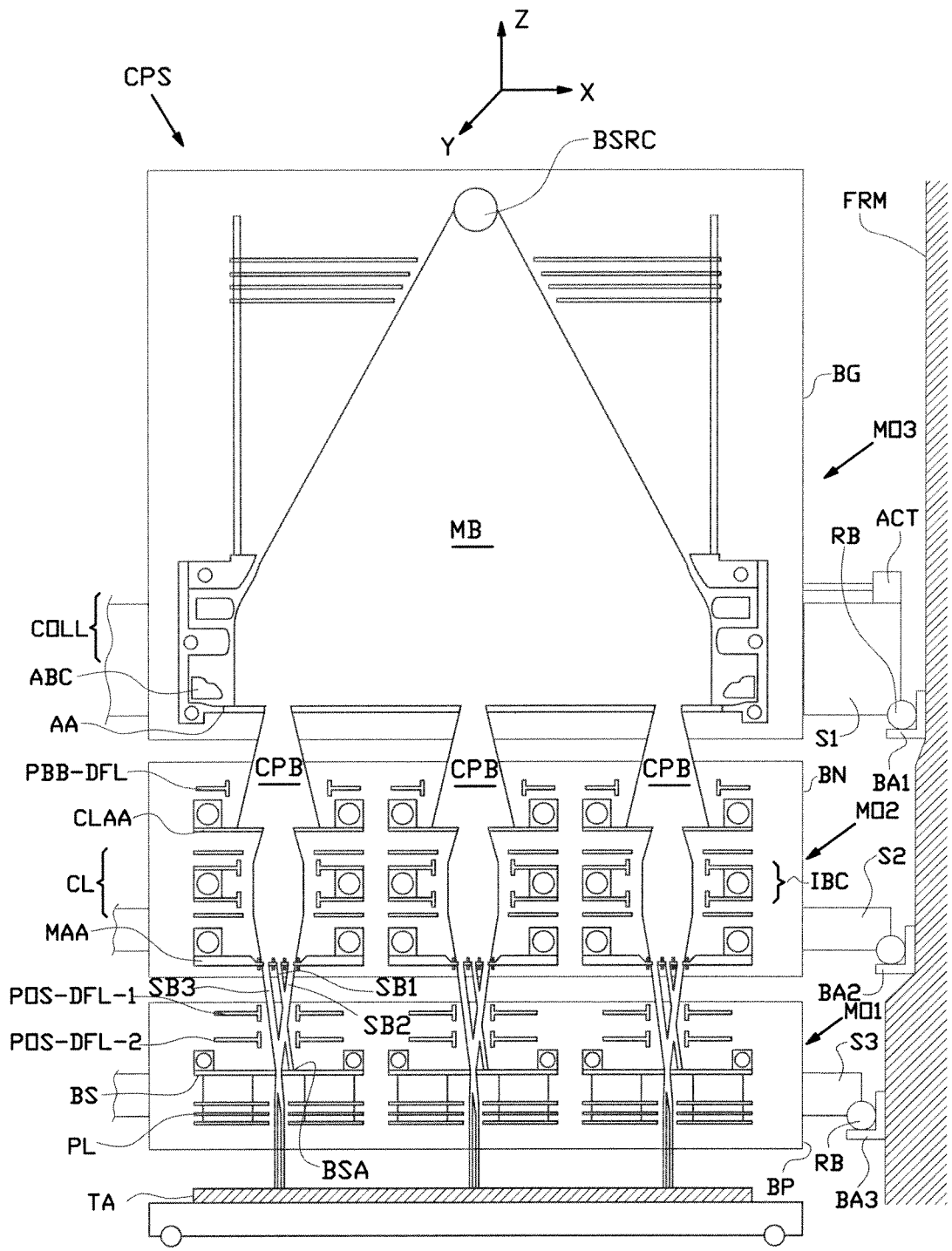
FIG. 3 shows a schematic overview of an embodiment of the charged particle system according to the invention.

FIG. 3 shows a schematic overview of an embodiment of the charged particle system according to the invention. The charged particle system CPS comprises three 25 modules: a beam generator module MO3, comprising a beam generator BG, a beam modulator module MO2, comprising a beam modulator BM and a beam projector module MO1, comprising a beam projector BP. Each of the beam generator BG, the beam modulator BM and the beam projector BP may be 30 arranged on a supporting structure S1, S2 and S3 respectively. Each module is supported by a frame FRM, which may have three bays BA1, BA2 and BA3. In each bay, a module, or in particular a support structure, may be accommodated. The three bays BA1, BA2 and BA3 may be 35 provided around the stack of modules, thus at least partially surrounding the stack of modules.

At the interface between the module and the bay, one or more reference balls RB may be provided in order to position the module in the bay with high accuracy. Each bay may be provided with three reference ball RB, in order to enable an accurate positioning of the module with respect to its bay.

In the text below, the term reference balls and the term support member may refer to the same technical element.

Figure 4A:
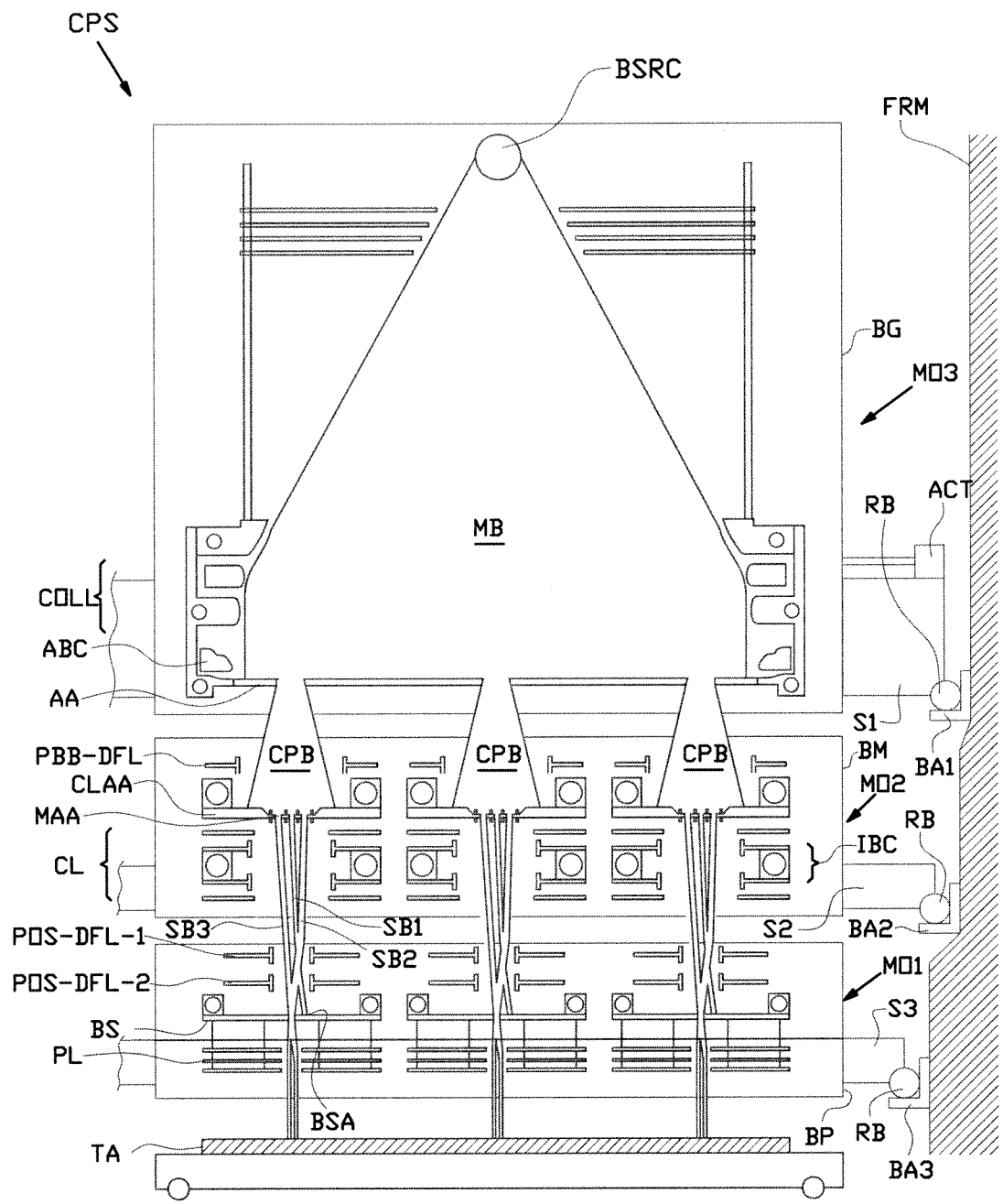
FIG. 4A and 4B show a schematic overview of two other embodiment of the charged particle system according to the invention.
Figure 4B:
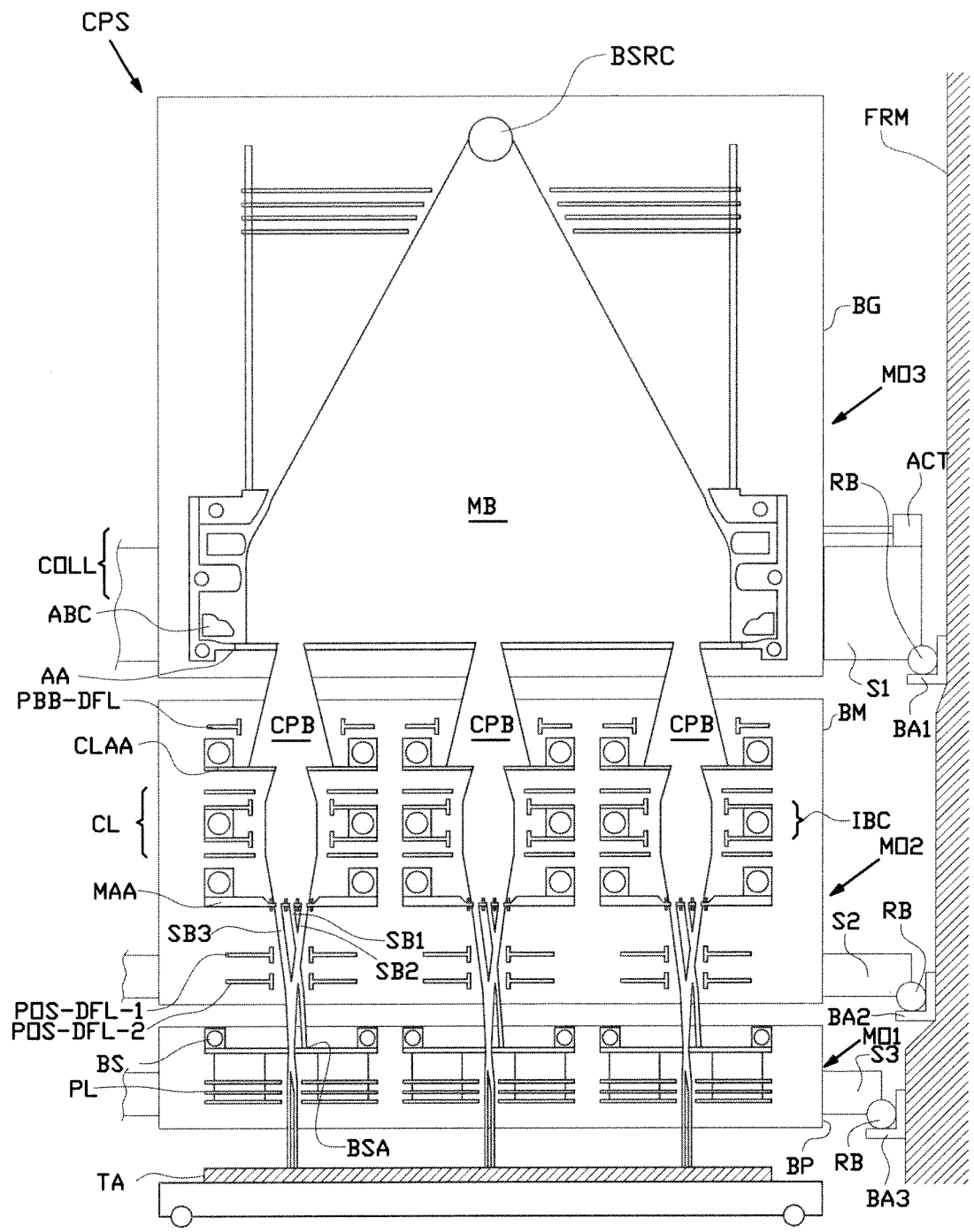

The beam generator BG comprises a beam source BSRC for generating a charged particle macro beam MB. The height of the beam generator BG with respect to the other modules may not be in proportion, as macro beam MB may be longer in the z-direction. Usually the charged particles are electrons. The beam generator BG further comprises an aperture array AA for generating a plurality of (charged particle) beams CPB from the charged particle macro beam MB. In the example of FIGS. 3, 4A and 4B three beams CPB have been depicted for clarity reasons, but the number of beams may also be in the range of hundreds, thousands or even ten-thousands.

The charged particle system comprises alignment elements for aligning beam with a downstream module element. The term "downstream" in this document is defined by the flow of charged particles from the source towards the target.

For example, the system may be provided with an actuator ACT arranged for rotating the beam generator about a z-axis and for moving the beam generator in an x-direction and/or y-direction. The x-, y- and z-direction are indicated in FIG. 2.

The beam generator BG may comprise a collimator COLL for focusing the charged particle macro beam generated by the beam source and may comprise an aberration corrector ABC for correcting aberration errors in said charged particle macro beam.

A voltage difference may be applied between the aberration corrector ABC and the aperture array AA, which provides a negative lens effect to each aperture of the aperture array. As a consequence, the beams CPB can be more or less divergent. However, it may also be possible to provide a positive lens effect.

The beam modulator BM is arranged to receive the charged particle beams CPB from the beam generator BG. The beam modulator may comprises module elements such as a modulation aperture array MAA for generating a plurality of subbeams SB1, SB2, SB3 from the beams CPB and for deflecting some of the subbeams to a beam stop area BSA of a beam stop aperture array BS. An example of such a subbeam is indicated by SB2. Thus the modulation aperture array MAA may function as a blanker array, which in combination with the beam stop aperture array BS prevents some beams or subbeams from impinging (or being projected) on the wafer or target TA, thus creating a pattern on the wafer.

The alignment elements may further comprise a deflector array PBB-DFL for deflecting the at least one charged particle beam from the aperture array in the x-direction and/or y-direction. In the embodiment of FIG. 3, the deflector array PBB-DFL is arranged in the beam modulator module MO2, or in particular in the beam modulator BM, but it may also be arranged in another module, i.e. the beam generator module MO3, or in particular in the beam generator BG.

The beam modulator may comprise a beam corrector array IBC for correcting individual angular errors of the beams CPB and a focus lens array CL for focusing the beams CPB. The beam corrector array IBC may also be arranged or configured for correcting positional errors between beams CPB.

The lenses of the focus lens array may each be an Einzel lens. In that case, the focus lens array comprises three subsequent electrode arrays. Each electrode array comprises an electrode with an array of apertures. A voltage difference is applied between the middle electrode arrays and the two outer electrode arrays. A voltage applied to the middle electrode array may be substantially 0 volt or a ground voltage of the system. A voltage applied to the two outer electrode arrays may be in the range of −0.5 to −2 kV. In the embodiment of FIG. 2, the beam corrector array IBC is provided as the middle electrode array of the Einzel lens.

In the embodiment of FIG. 3, the beam corrector array IBC is arranged between the aperture array AA and the modulation aperture array MAA. However, it is possible to provide or to position the beam corrector array IBC between the modulation aperture array MAA and the beam projector BP, as is shown in FIG. 4A.

The beam modulator may be provided with a current limiting aperture array CLAA. The current limiting aperture array CLAA is arranged for shielding the beam corrector array IBC from the divergent beams CPB. The current limiting aperture array CLAA prevents charged particles from impinging on the electrodes of the beam corrector array IBC. Charged particles impinging on the beam corrector array IBC may cause damage to the electrodes of the beam correctors.

Because of the required shielding, the spot of the beams on the current limiting aperture array may be larger than a respective aperture of the array.

An advantage of a spot of a beam on an aperture array being larger than its respective aperture, is that it reduces aberration errors, which are mostly found in the radial outer portions of a beam. Therefore, the negative lens effect as described above may also contribute to smaller aberration errors.

The beam projector BP may be arranged for receiving the subbeams SB1, SB2, SB3 from the beam modulator. The beam projector comprises a beam stop aperture array BS with beam stop area BSA. As can been seen in FIG. 2, a subbeam SB3 that is deflected to the beam stop area BSA will not pass through the beam stop aperture array and will not reach the target surface.

The beam projector further comprises a projection lens PL for projecting subbeams on the surface of the wafer TA.

The alignment elements may comprise a set of two subsequent deflector arrays POS-DFL-1 and POS-DFL-2. The set is arranged for displacing the subbeams in the x-direction and/or the y-direction with respect to the beam stop array. The set is arranged between the modulation aperture array and the beam stop aperture array. The set 10 may be part of the beam modulator module MO2, or in particular of the beam modulator BM (see FIG. 2), or part of the beam projector module MO3, or in particular of the beam projector BM (see FIG. 4).

The deflector POS-DFL-1 may be arranged for deflecting multiple subbeams in 15 an x-direction and/or a y-direction.

The set of two subsequent deflector arrays POS-DFL-1 and POS-DFL-2 contributes to the alignment of the beams or subbeams with respect to beam stop array or the projection lens array. It may correct positional error of the (sub) beams and/or it may correct angular errors of the (sub) beam.

The beam projector module may further comprise one or more scanning deflector arrays for scanning the beams (or subbeams) over the target while processing said target.

FIG. 4A shows a schematic overview of another embodiment of the charged particle system according to the invention. The embodiment of FIG. 4 differs only from the embodiment of FIG. 3 in the arrangement of the beam modulator. In FIG. 4, the beam corrector array IBC and the focus lens array CL are provided between the modulation aperture array MAA and the beam projector BP, while in FIG. 3, the beam corrector array IBC and the focus lens array CL are provided between beam generator BG and the modulation aperture array MAA.

When the beam corrector IBC is provided between the modulation aperture array MAA and the beam projector BP, a current limiting aperture array is not required, since the modulation aperture array MAA can shield the beam corrector IBC. In that case, the spot of the beams on the modulation aperture array MAA is larger than a respective aperture of the modulation aperture array. Because of this arrangement, the current limiting aperture array CLAA has been omitted in FIG. 4.

FIG. 4B shows a schematic overview of yet another embodiment of the charged particle system according to the invention. The embodiment of FIG. 4B differs only from the embodiment of FIG. 3 in the arrangement of the set of the two subsequent deflector arrays POS-DFL-1 and POS-DFL-2. In the embodiment of FIG. 4B, the set is part of the beam modulator while in FIG. 3 the set is part of the beam projector.

FIG. 3, 4A and 4B are examples of different arrangement of some of the elements of the charged particle system according to the invention. It is to be understood that other arrangements are also possible.

In general, the alignment of the beams with the beam modulator may be provided by at least one of:
(1) moving and/or rotating the beam generator BG,
(2) generating divergent beams CPB, and (3) deflecting the beams CPB using the deflector array PBB-DFL.

Furthermore, the alignment of the (sub) beams with the beam projector BP may be provided the set of two subsequent deflector arrays POS-DFL-1 and POS-DFL-2.

As illustrated in the figures, the distance between two adjacent modules should be as small as possible, because positional errors between beams (charged particle beams or subbeams) increase with this distance.

This also applies with respect to the distance between elements inside a module: distances between module elements may be minimized in order to minimize positional errors between beams. It may therefore be advantageous to provide these element as close to each other as possible, for example by integrating the elements, for example with lithographical technologies, on a single substrate.

In all embodiments of the charged particle system according to the invention, it may be the case that each module is pre-calibrated. In other words, the modules are calibrated before they are inserted in the bays of the frame. Calibration indicates that the elements within a module are aligned with each other and their functioning together has been checked. After inserting a pre-calibrated module in the frame, only the alignment of the module itself with other modules has to take place. The use of pre-calibrated modules enables a fast replacement of a module. This decreases the downtime of the charged particle system during maintenance.

Cooling tubes CT (or a cooling system) for cooling one or more planar substrates may further be provided. The cooling system may comprise the cooling tubes CT adjacent to the through openings and a pump for pumping a cooling fluid (such as water) through the cooling tubes.

In the above is also described how at least one of a plurality of beams and/or a plurality of subbeams can be aligned with a pertaining downstream module element in a charged particle system as described above, as a method, comprising the step of rotating the beam generator about a z-axis, parallel with an optical axis of the optical column, and/or moving the beam generator in an x-direction and/or y-direction, the x-direction being perpendicular to the z-axis and the y-direction being perpendicular to both the z-axis and the x-direction.

The method may further comprise deflecting said plurality of charged particle beams from the aperture array, in the x-direction and/or y-direction and deflecting said at least part of said plurality of subbeams in an x-direction and/or a y-direction.

Moreover, the method may comprise displacing said plurality of beams or said plurality of subbeams in the x-direction and/or the y-direction with respect to the beam stop array, using one or more deflector arrays and may comprise arranging one or more of said modules in a fixed position in said frame.

Figure 5:
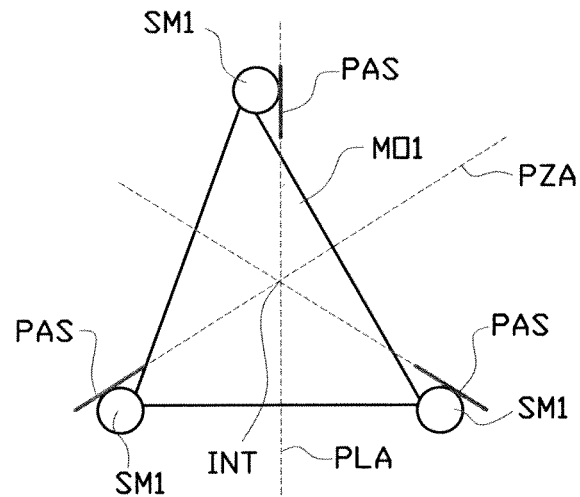
FIG. 5 shows a schematic top view of the thermal stable positioning of a module.

FIG. 5 schematically shows a top view of a thermal stable positioning of a module MO1 in a frame. The module is provided with three at least substantially spherical support members SM1. The frame, which will be described in more detail below, comprises three planar alignment surfaces PAS, which are angularly off-set with respect to each other. When arranged in the frame, each of 10 the three support members SM1 of the module MO1 lies alongside against a corresponding one of the three alignment surfaces PAS. To ensure that the support members SM1 stay in contact with the corresponding alignment surfaces PAS, a force may be applied on said module in 15 order to push the support members SM1 against the alignment surfaces PAS.

Each one of the three alignment surfaces PAS extends in a corresponding plane PLA, wherein the corresponding planes PLA of the three planar alignment surfaces PAS intersect in one intersecting point INT. This intersecting point INT is at least substantially arranged in the middle of the module MO1. When the module MO1 or the frame experiences an extension or contraction, for example due to changes in temperature, the spherical support members SM1 will slide along the alignment surfaces PAS. However, the position of the intersecting point INT will not change. Thus the intersecting point INT provides a thermal centre. Arranging the functional elements at or near the intersecting point INT or thermal centre, makes the alignment of the functional elements at least substantially independent from thermal expansion or contraction of the modules and/or the frame.

Figure 6:
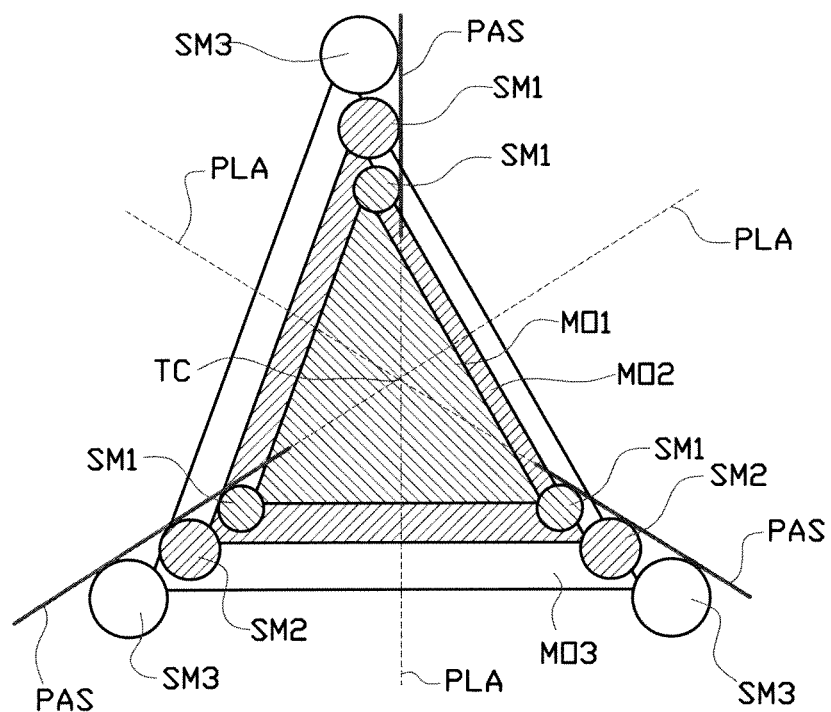
FIG. 6 shows a schematic bottom view of three modules on top of each other.

According to the invention, this same principle is applied in a stack as shown in FIG. 6. FIG. 6 shows an assembly for providing an accurately aligned stack of two or more modules MO1, MO2, MO3, in a stacking direction which is substantially along the viewing direction.

The third module MO3 may be the beam generator module as described above. The second module MO2 may be the beam modulator module as described above. The first module MO1 may be the beam projector module as 5 described above.

In this example each of the three modules MO1, MO2, MO3, comprises three support members SM1, SM2, SM3. When arranged in the frame, each of the three support members SM1, SM2, SM3 of the modules MO1, MO2, MO3 lies alongside against a corresponding one of the three alignment surfaces PAS. Since each one of the alignment surfaces PAS acts as a stop surface of one of the support members SM1, SM2, SM3 of each module MO1, MO2, MO3, the thermal centers TC of each of the modules MO1, MO2, MO3 are accurately arranged on top of each other in the stacking direction.

Furthermore, as shown in FIG. 6, the spherical support members SM1, SM2, SM3 can be of different size. In particular, the diameter of the spherical support members SM1 of the lowest module MO1 is smaller than the diameter of the spherical support members SM2 of the second module MO2, which is arranged above the lowest module MO1, and the diameter of the spherical support members SM2 of the second module MO2 is smaller than the diameter of the spherical support members SM3 of the third module MO3, which is arranged above the second module MO2.

As also shown in FIG. 6, the three support members SM2 of the second module MO2 are arranged at least substantially outside a triangle defined by support members SM1 of the first module MO1, and the three support members SM3 of the third module MO3 are arranged at least substantially outside a triangle defined by support members SM2 of the second module MO2.

Figure 7:
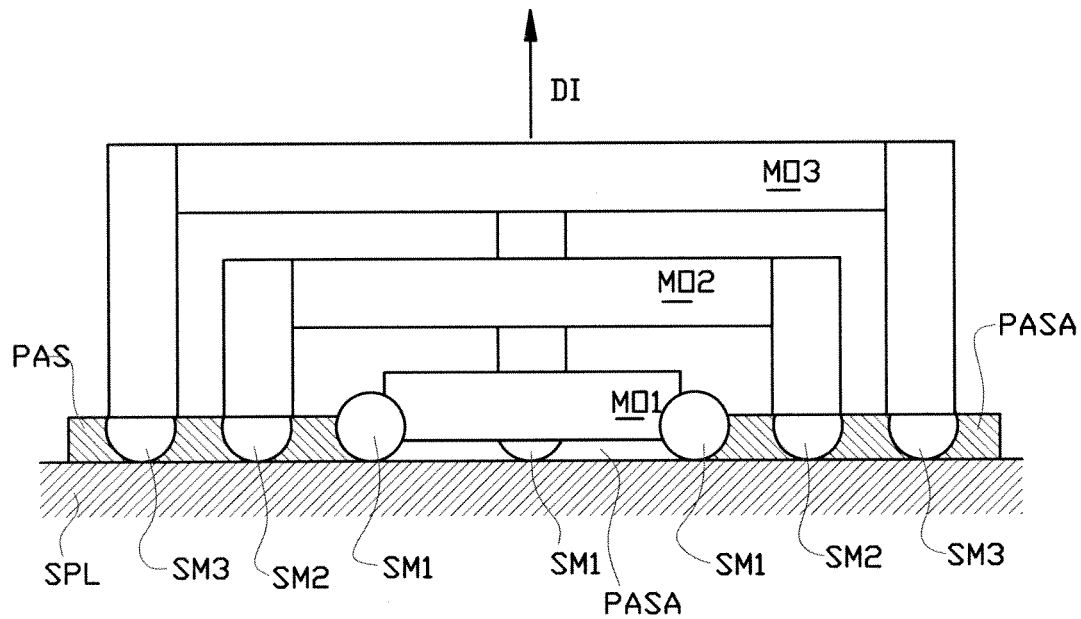
FIG. 7 shows a side view of a first embodiment of the three modules of FIG. 6.

In a first exemplary embodiment as shown in FIG. 7, the frame comprising three planer alignment surfaces PASA which extend in the stacking direction DI. In addition, the frame comprises support surfaces arranged in a first plane SPL for supporting the support members SM1, SM2, SM3 of three modules MO1, MO2, MO3. Although this embodiment provides an assembly for arranging modules MO1, MO2, MO3 in a stack with high accuracy and wherein the alignment of the functional elements, when arranged in or near the thermal centers TC, is at least substantially independent from temperature variations, the schematic side view of FIG. 7 shows that the second module MO2 reaches over the first module MO1, and the third module MO3 reaches over the second module MO2.

Actually it would be beneficial when every one of the modules MO1, MO2, MO3 can be inserted from a front side of the assembly, for example substantially along the viewing direction of FIG. 7. In view of this, it is noted that in the first exemplary embodiment, it is necessary to remove the first module MO1 before the second module MO2 can be removed, and it is necessary to remove both the first module MO1 and the second module MO2 before the third module MO3 can be removed.

Figure 8:
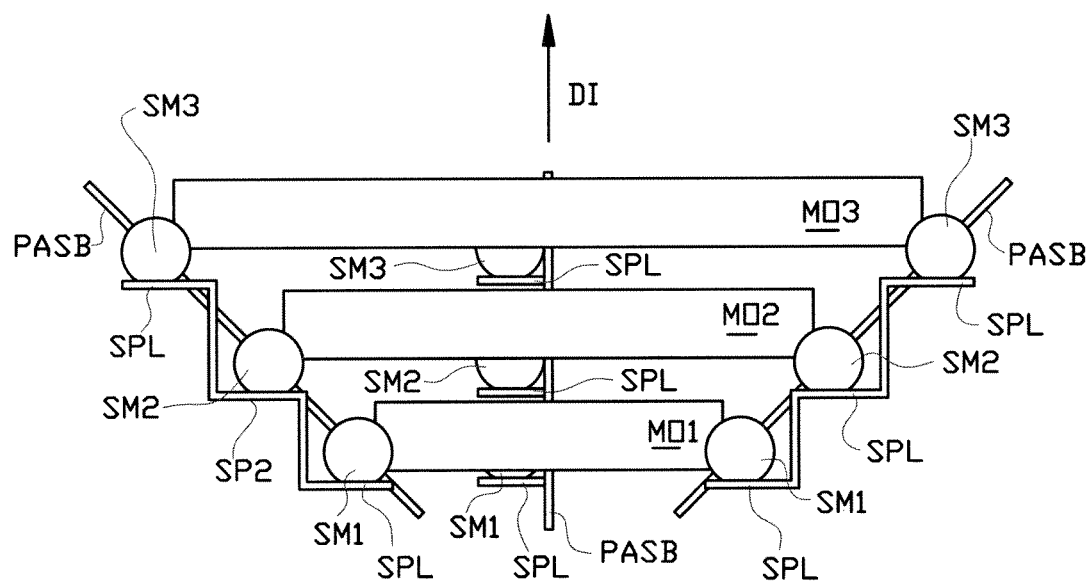
FIG. 8 shows a side view of a second embodiment of the three modules of FIG. 6.

In a second exemplary embodiment as shown in FIG. 8, the frame comprising three planer alignment surfaces which are arranged on a ridge PASB extends in the stacking direction DI, and which recede from each other in the stacking direction DI. In addition, the frame comprises support surfaces SPL which are arranged in the different levels supporting the support members SM1, SM2, SM3 of three modules MO1, MO2, MO3 each on its corresponding level. In particular this embodiment three stair-shaped support surfaces SPL for supporting the support member SM1, SM2, SM3 of the modules MO1, MO2, MO3 at their corresponding level. This arrangement as shown in FIG. 8, makes it possible that every module MO1, MO2, MO3 can be inserted or removed from the front side of the assembly, thus substantially along the viewing direction of FIG. 8.

As further shown in FIG. 8, the three support surfaces SPL for supporting the support members SM2 of the second module MO2 are arranged above the three support surfaces SPL for supporting the support members SM1 of the firs module MO1.

Figure 9:
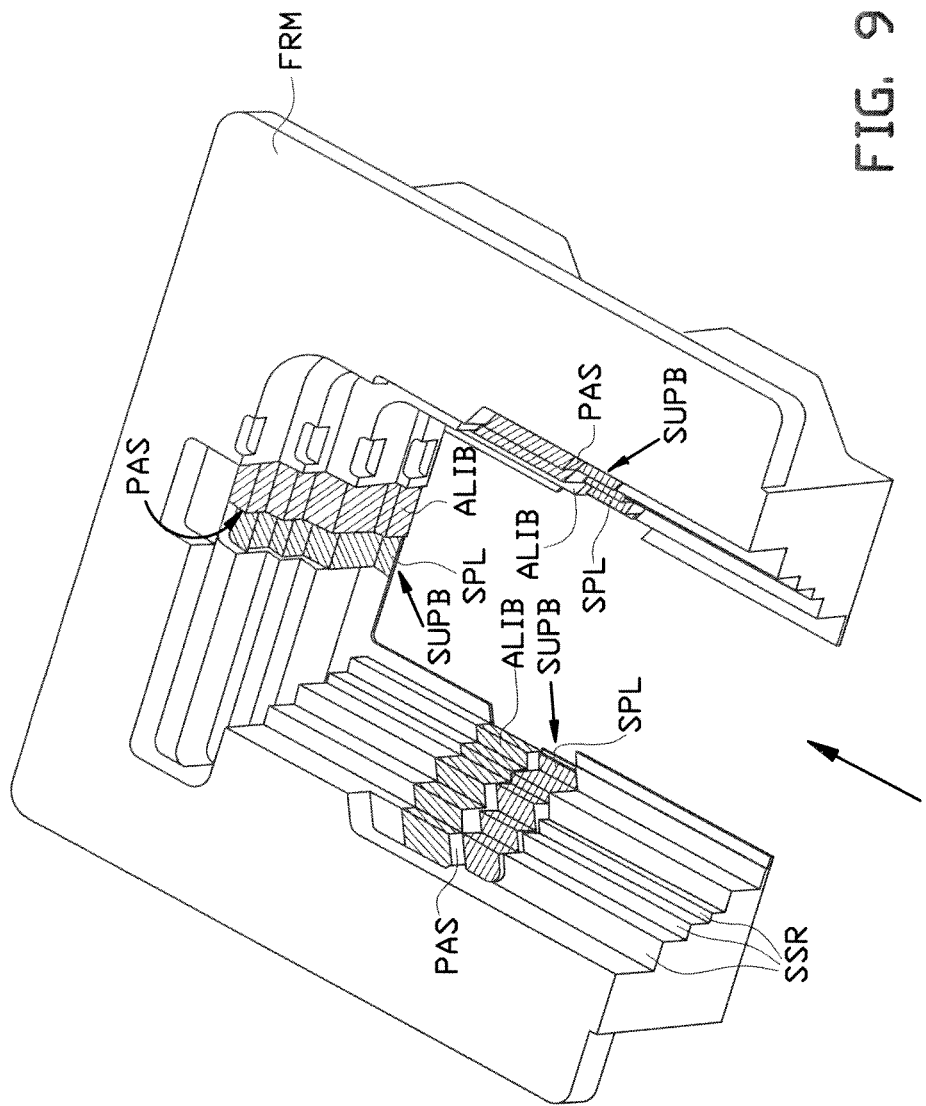
FIG. 9 shows a schematic view of a frame for arranging the modules as shown schematically in FIG. 8.

FIG. 9 shows a frame FRM for the second exemplary embodiment as shown in FIG. 8. The frame FRM is substantially U-shaped, and is provided with inserts ALIB, SUPB which provide the alignment surfaces PAS and the support surfaces SPL. The frame FRM can be made from an easy to machine material, for example aluminum. Each of the three plane alignment surfaces PAS for aligning all modules of said stack, is a side-surface of a monolithic alignment block ALIB which is inserted in the frame FRM. The monolithic alignment blocks ALIB are made from a hard material, such as titanium, and the alignment surface PAS preferably is provided with a diamond like coating.

Alternatively the side-surfaces PAS may be provided with a ridge PASB, as shown in FIG. 8, wherein the side of the ridge PASB facing the spherical support members SM1, SM2, SM3 then acts as the planar alignment surface.

Also the support surfaces SPL, which are adjacent to one of the three plane alignment surfaces PAS, are arranged in a monolithic support block SUPB, which is connected to the frame FRM. The monolithic supporting block SUPB is also made from a hard material, such as titanium, and the support surfaces SPL preferably are provided with a diamond like coating.

As shown in FIG. 9, The frame FRM is provided with an opening between two of the three plane alignment surfaces PAS for inserting the modules in the assembly along the insert direction R.

Figure 10:
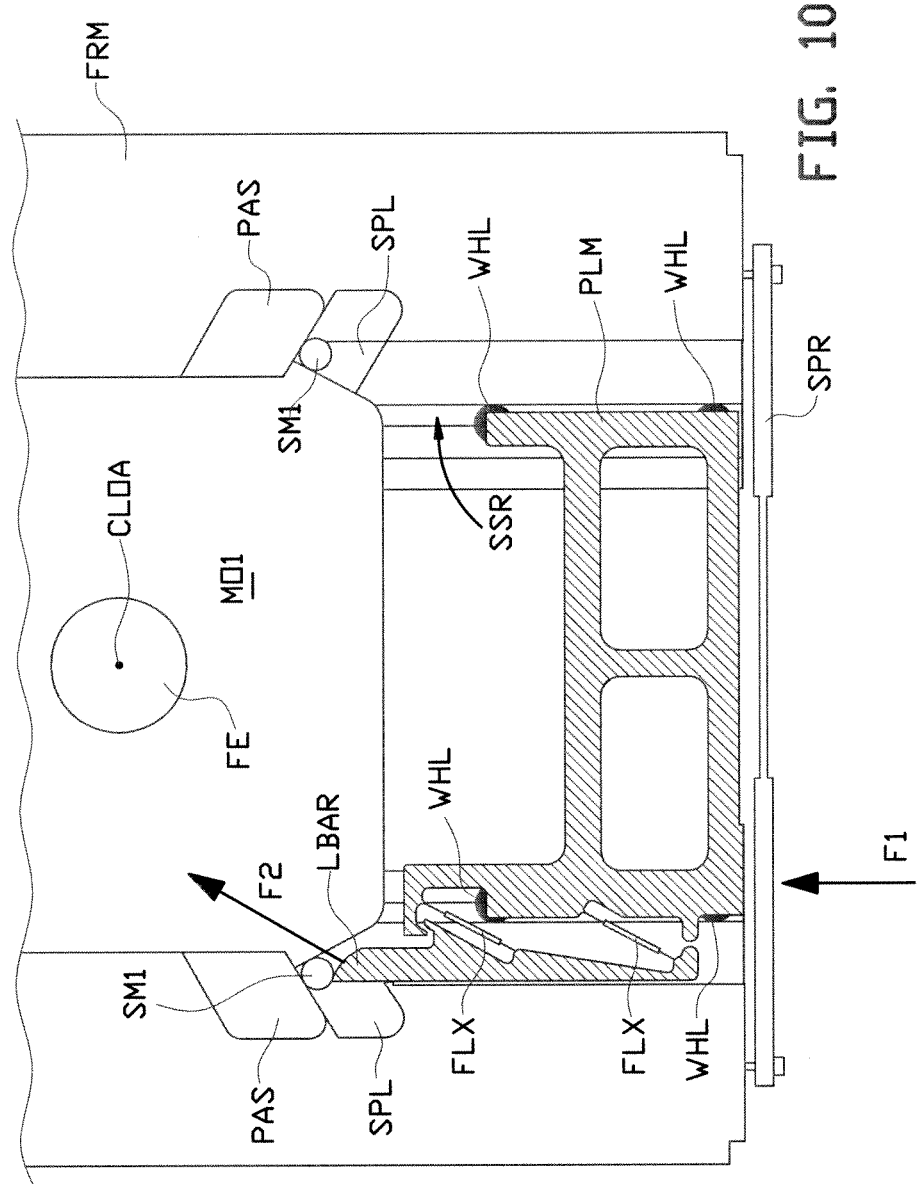
FIG. 10 shows a module arranged in the frame of FIG. 9, which is further provided with a pre-load member for applying a force on said module.

FIG. 10 shows the arrangement of a module MO1 in the frame FRM. As shown in FIG. 10, a pre-load member PLM is provided for applying a force F2 on the module MO1, in particular on one of the support members SM1 of the module MO1, for pushing the three support members SM1 of the module MO1 against the corresponding one of the three alignment surfaces PAS. The pre-load member PLM is movably arranged in the frame FRM and is provided with wheels WHL which are guide by stair-shaped recesses SSR in the frame, to be able to freely move along the insert direction R.

In order to apply the force F2 on the module MO1, so it remains in its place and to make sure that the force F2 on the module is applied in the correct direction, the pre-load member PLM is provided with a load bar LBAR, which is connected to the pre-load member PLM via two flexures FLX which at least substantially extend in a direction parallel to the correct direction of the applied force F2. This particular designed pre-load member PLM with the load bar LBAR delivers the correct force F2 on one of the spherical support members SM1 of the module MO1, when a normal force F1 is applied on the preload plate. This normal force F1 is provided by a spring SPR, which is connected to the frame FRM and which spring SPR also closes the insert opening for a module in the frame FRM.

The angular off-set of the alignment surfaces PAS and/or the position of the support member SM1 are arranged in order to provide abutment of all three of the support members SM1 against all three alignment surfaces PAS, just by applying the force F2 on only one of the three support member SM1.

In addition, the module MO1 is provided with one or more functional elements FE, such as a projection lens array and a scanning deflector array. The module MO3 may be provided with one or more functional elements such as a beam source and/or manipulation devices, for example a deflector and/or lenses, for manipulating a beam when emitted from said beam source, while the module MO3 may be provided with one or more functional elements such as a modulation aperture array and/or a blanker array.

The functional elements FE are arranged in and/or on the module MO1, in such a way that when the module MO1 is inserted in the frame FRM, and the support members SM1 of the module MO1 is arranged against the alignment surfaces PAS, a centre line and/or optical axis CLOA of said functional elements FE at least substantially coincides with the thermal centre of the aligned stack.

Preferably each module MO1, MO2, MO3 when arranged in the frame FRM is provided with its won pre-load member.

Figure 11:
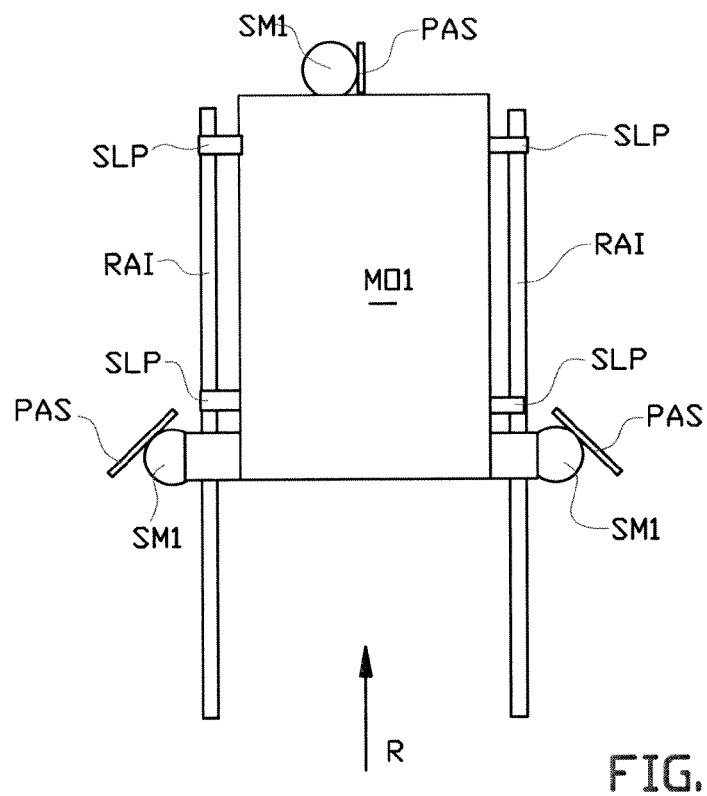
FIG. 11 schematically shows the rails for supporting and guiding a module during an insertion thereof in the frame.
Figure 12A:
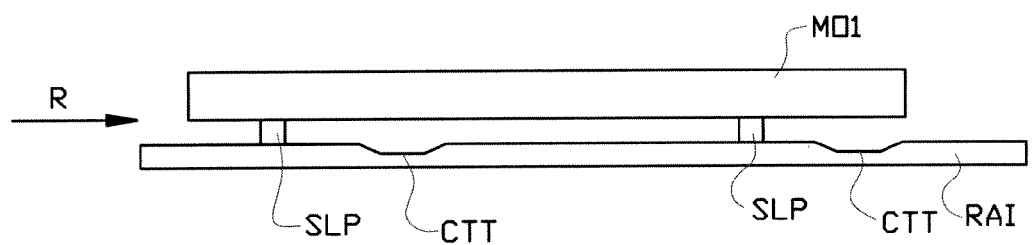
FIG. 12A schematically shows the module during the insertion.

In a further exemplary embodiment as shown in FIG. 11, the module MO1 is provided with slider pins SLP and the frame FRM is provided with rails RAI. To make it easier to place a module MO1 in the frame FRM, the module MO1 is supported on the rails RAI and can slide along the rails RAI in the insert direction R as shown in FIG. 12A.

Figure 12B:
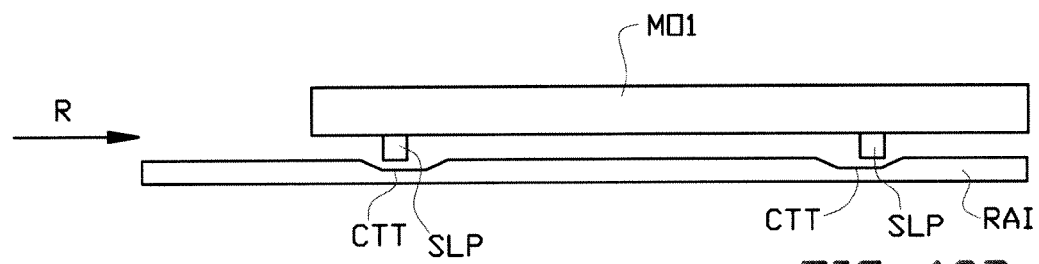
FIG. 12B schematically shows the module at the correct position in the stack and being free from the rails.

A pair of rails RAI are arranged for supporting and guiding one module MO1 during an insertion thereof in the assembly. When the module MO1 has arrived at the required position, thus when the support members SM1 are abutting the alignment surfaces PAS and are supported by the support surfaces SPL, the module is no longer supported by the rails as shown in FIG. 12B. In this required position of the module MO1, the slider pins SLP are arranged above a cutout CTT of the rails RAI.

It may be understood that any embodiment of a lithography system having alignment elements as described above may also be provided with modules according to any of the embodiments of the assembly for providing an aligned stack of two or more modules in a stacking direction as described in this document.

Embodiments according to the inventions may also be described by one or more of the following clauses:

1] Assembly for providing an aligned stack of two or more modules in a stacking direction,
wherein each of the two or more modules comprises three support members,
wherein the assembly comprises a frame comprising three planar alignment surfaces which extend in the stacking direction and which are angularly off-set with respect to each other, and
wherein each of the three support members of each one of the two or more modules, when arranged in said frame, abuts against a corresponding one of the three alignment surfaces.

2] Assembly according to clause 1, wherein each one of the three alignment surfaces extend in a corresponding plane, and wherein the corresponding planes of the three planar alignment surfaces intersect in one intersecting line, which intersecting line extends in the stacking direction.

3] Assembly according to clause 1 or 2, further comprising a pre-load member for applying a force on at least one of the two or more modules for pushing the three support members of the at least one of the two or more modules against the corresponding one of the three alignment surfaces.

4] Assembly according to clause 1, 2 or 3, wherein the frame comprises three support surfaces arranged in a first plane for supporting the support members of a first module of said two or more modules, and wherein the frame comprises three support surfaces arranged in a second plane for supporting the support members of a second module of said two or more modules, wherein the second plane is at least substantially parallel to the first plane.

5] Assembly according to clause 4, wherein the first and second plane extend at least substantially perpendicular to the stacking direction.
6] Assembly according to clause 4 or 5, wherein each of the three support surfaces for supporting the support members of a first module are arranged adjacent to one of the three plane alignment surfaces.
7] Assembly according to clause 4, 5 or 6, wherein the three support surfaces for supporting the support members of the second module are arranged above the three support surfaces for supporting the support members of the firs module.
8] Assembly according to clause 7, wherein the three support members of the second module are arranged at least substantially outside a triangle defined by support members of the first module.
9] Assembly according to any one of the previous clauses, wherein at least one of said support members of the two or more modules is a ball, preferably wherein each support member is a ball.
10] Assembly according to any one of the previous clauses, wherein each of the three plane alignment surfaces is arranged in an at least substantially vertical plane, wherein said vertical planes intersect in an at least substantially vertical intersecting line which intersecting line defines the thermal centre of the aligned stack.
11] Assembly according to any one of the previous clauses, wherein the frame is provided with an opening between two of the three plane alignment surfaces for inserting the two or modules in the assembly.
12] Assembly according to clause 11, wherein the assembly comprises rails for supporting and guiding at least one of the two or modules during an insertion thereof in the assembly, wherein the rails are arranged such that an inserted module is free from said rail.
13] Assembly according to any one of the previous clauses, wherein each of the three plane alignment surfaces for aligning all modules of said stack of two or more modules in a stacking direction, is a side-surface of a monolithic alignment block which is connected to the frame, wherein the monolithic alignment block is made from a hard material, such as titanium, and wherein the side-surface preferably is provided with a diamond like coating.
14] Assembly according any one of the previous clauses, wherein each of the three planar alignment surfaces is arranged on a ridge.
15] Assembly according to any one of the previous clauses, when dependent on clause 6, wherein each of the support surfaces adjacent to one of the three plane alignment surfaces are arranged in a monolithic support block which is connected to the frame, wherein the monolithic supporting block is made from a hard material, such as titanium, and wherein the support surfaces preferably are provided with a diamond like coating.
16] Lithography system comprising an assembly according to any one of the previous clauses.
17] Lithography system according to clause 16, comprising:
a first module comprising a source for one or more charged particle beams,
a second module comprising a deflector for said one or more charged particle beams, and
a third module comprising a projection lens for projecting said one or more charged particle beams onto a target,
wherein the first, second and third modules are inserted in the assembly to provide accurately aligned stack of said modules.
18] Lithography system according to clause 17, wherein the source, the deflector and the projection lens are arranged at least substantially at or near the thermal centre of the aligned stack.
19] Microscopy system comprising an assembly according to any one of the clauses 1 to 15.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Charged particle system for processing a target surface with charged particle beams, the system comprising an optical column for projecting said beams on the target surface, wherein the optical column comprises three replaceable modules, each module comprising at least one module element, the three modules comprising a beam generator module, a beam modulator module and a beam projector module, wherein a module element of the beam generator module comprises a beam generator, said beam generator is arranged for generating one or more charged particle beams, substantially directed to the beam modulator module, wherein the optical column comprises an aperture array for splitting up said one or more charged particle beams into a plurality of subbeams, wherein a module element of said beam modulator module comprises a beam modulator for switching on and off said plurality of subbeams, wherein the beam modulator comprises a modulation aperture array arranged for deflecting some of said plurality of subbeams to a beam stop area to prevent these from being projected on the target surface, wherein said beam projector module comprises a beam projector for receiving said plurality of subbeams and for projecting said subbeams on said target surface, the beam projector comprising module elements comprising:

a projection lens array for projecting said at least some of the received subbeams on the target surface, and a beam stop aperture array with said beam stop area, wherein said beam stop aperture array is arranged between the projection lens array and the modulation aperture array; and wherein the system further comprises:

a frame separately supporting each of said separate replaceable modules in a fixed position, and alignment elements for aligning at least said plurality of subbeams with the beam stop aperture array, the alignment elements comprising at least a first alignment element, and wherein the first alignment element comprises electro-optical elements to align said plurality of subbeams between the replaceable modules using electrical fields, and wherein the first alignment element is included in said optical column between said beam stop aperture array and said modulation aperture array and is arranged in either the beam projector module or in the beam modulator module.

2. Charged particle system according to claim 1, wherein the first alignment element is a deflector array, arranged for deflecting at least a part of said plurality of subbeams in an x-direction and/or an y-direction with respect to the beam stop array.

3. Charged particle system according to claim 1, wherein the first alignment element is a set of two subsequent deflector arrays, wherein the set is arranged for displacing at least a part of said plurality of subbeams in an x-direction and/or a y-direction with respect to the beam stop array.

4. Charged particle system according to claim 3, wherein said set is arranged in the beam modulator module.

5. Charged particle system according to claim 1, wherein the alignment elements further comprising a second alignment element, wherein the second alignment element is a deflector array arranged for deflecting said one or more charged particle beams in an x-direction and/or a y-direction.

6. Charged particle system according to claim 5, wherein the second alignment element is included in said optical column between said aperture array and said modulation aperture array.

7. Charged particle system according to claim 1, wherein the module elements of the beam generator module further comprises a beam source for generating a charged particle macro beam, and a collimator lens for collimating the charged particle macro beam.

8. Charged particle system according to claim 1, wherein the module elements of the beam modulator module further comprise a focus lens array for focusing said one or more charged particle beams or said plurality of subbeams.

9. Charged particle system according to claim 8, wherein the focus lens array is arranged before the modulation aperture array.

10. Charged particle system according to claim 1, wherein the module elements of the beam modulator further comprise a beam corrector array for correcting individual angular errors of said one or more charged particle beams or said plurality of subbeams.

11. Charged particle system according to claim 10, wherein the alignment elements further comprising a second alignment element, wherein the second alignment element is a deflector array arranged for deflecting said one or more charged particle beams in an x-direction and/or a y-direction, and wherein said beam corrector array is arranged after the second alignment element.

12. Charged particle system according to claim 1, wherein the modulation aperture array is further arranged as the aperture array for generating the plurality of subbeams form said one or more charged particle beams.

13. Method for aligning at least one of one or more charged particle beams and/or a plurality of subbeams in a charged particle system for processing a target surface with charged particle beams, the system comprising an optical column for projecting said beams on the target surface, wherein the optical column comprises three replaceable modules, each module comprising at least one module element, the three modules comprising a beam generator module, a beam modulator module and a beam projector module, wherein a module element of the beam generator module comprises a beam generator, said beam generator is arranged for generating one or more charged particle beams, substantially directed to the beam modulator module, wherein the optical column comprises an aperture array for splitting up said one or more charged particle beams into a plurality of subbeams, wherein a module element of said beam modulator module comprises a beam modulator for switching on and off said plurality of subbeams, wherein the beam modulator comprises a modulation aperture array arranged for deflecting some of said plurality of subbeams to a beam stop area to prevent these from being projected on the target surface, wherein said beam projector module comprises a beam projector for receiving said plurality of subbeams and for projecting said subbeams on said target surface, the beam projector comprising module elements comprising:

a projection lens array for projecting said at least some of the received subbeams on the target surface, and a beam stop aperture array with said beam stop area, wherein said beam stop aperture array is arranged between the projection lens array and the modulation aperture array; and wherein the system further comprises:

a frame separately supporting each of said separate replaceable modules in a fixed position, and alignment elements for aligning at least said plurality of subbeams with the beam stop aperture array, the alignment elements comprising at least a first alignment element, and wherein the first alignment element comprises electro-optical elements to align said plurality of subbeams between the replaceable modules using electrical field, wherein the first alignment element is included in said optical column between said beam stop aperture array and said modulation aperture array and is arranged in either the beam projector module or in the beam modulator module, and wherein the first alignment element is a deflector array, arranged for deflecting at least a part of said plurality of subbeams in an x-direction and/or an y-direction with respect to the beam stop array wherein the method comprises the step of:

displacing said plurality of subbeams in an x-direction and/or an y-direction using the deflector array for alignment of said plurality of subbeams with a module element downstream of said at least one deflector array.

14. Method according to claim 13, further comprising the step of: deflecting said at least part of said plurality of subbeams from the aperture array in the x-direction and/or y-direction.

15. Method according to claim 13, further comprising the step of:

arranging one or more of said modules in a fixed position in the frame of said charged particle system prior to the alignment of said plurality of subbeams with a module element downstream of said at least one deflector array.

* * * * *